(12) United States Patent
Wu et al.

(10) Patent No.: US 7,692,263 B2
(45) Date of Patent: Apr. 6, 2010

(54) HIGH VOLTAGE GAN TRANSISTORS

(75) Inventors: Yifeng Wu, Goleta, CA (US); Primit Parikh, Goleta, CA (US); Umesh Mishra, Montecito, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 11/603,427

(22) Filed: Nov. 21, 2006

(65) Prior Publication Data

US 2008/0116492 A1 May 22, 2008

(51) Int. Cl.
*H01L 29/93* (2006.01)
(52) U.S. Cl. ............... 257/488; 257/367; 257/E29.009; 257/E21.403; 257/E21.407
(58) Field of Classification Search ......... 257/194, 257/367, 488, 343, E29.266, E29.009, E21.403, 257/E21.407
See application file for complete search history.

(56) References Cited

U.S. PATENT DOCUMENTS

| 4,551,905 A | 11/1985 | Chao et al. ............ 29/571 |
| 4,947,232 A | 8/1990 | Ashida et al. ............ 357/53 |
| 5,192,987 A | 3/1993 | Khan et al. ............ 257/183.1 |

(Continued)

FOREIGN PATENT DOCUMENTS

EP 0069429 A 1/1983

(Continued)

OTHER PUBLICATIONS

Saito W. et al. "Design and Demonstration of High Breakdown Voltage GaN High Electron Mobility Transistor (HEMT) Using Field Plate Structure for Power Electronics Applications", Japanese Journal of Applied Physics, Japan Society of Applied Physics, Tokyo, JP vol. 43, No. 4B, Apr. 2004, pp. 2239-2242, ISSN: 021-4922.

(Continued)

*Primary Examiner*—Zandra Smith
*Assistant Examiner*—Paul E Patton
(74) *Attorney, Agent, or Firm*—Koppel, Patrick, Heybl & Dawson

(57) ABSTRACT

A multiple field plate transistor includes an active region, with a source, a drain, and a gate. A first spacer layer is over the active region between the source and the gate and a second spacer layer over the active region between the drain and the gate. A first field plate on the first spacer layer is connected to the gate. A second field plate on the second spacer layer is connected to the gate. A third spacer layer is on the first spacer layer, the second spacer layer, the first field plate, the gate, and the second field plate, with a third field plate on the third spacer layer and connected to the source. The transistor exhibits a blocking voltage of at least 600 Volts while supporting a current of at least 2 Amps with an on resistance of no more than 5.0 mΩ-cm², of at least 600 Volts while supporting a current of at least 3 Amps with an on resistance of no more than 5.3 mΩ-cm², of at least 900 Volts while supporting a current of at least 2 Amps with an on resistance of no more than 6.6 mΩ-cm², or a blocking voltage of at least 900 Volts while supporting a current of at least 3 Amps with an on resistance of no more than 7.0 mΩ-cm².

19 Claims, 3 Drawing Sheets

U.S. PATENT DOCUMENTS

| | | | | |
|---|---|---|---|---|
| 5,196,359 | A | 3/1993 | Shih et al. | 437/40 |
| 5,296,395 | A | 3/1994 | Khan et al. | 437/40 |
| 5,399,886 | A | 3/1995 | Hasegawa | 257/192 |
| 5,885,860 | A | 3/1999 | Weitzel et al. | 438/179 |
| 6,033,948 | A | 3/2000 | Kwon et al. | 438/217 |
| 6,046,464 | A | 4/2000 | Schetzina | 257/96 |
| 6,071,780 | A | 6/2000 | Okamoto et al. | 438/287 |
| 6,100,571 | A | 8/2000 | Mizuta et al. | 257/488 |
| 6,307,232 | B1 | 10/2001 | Akiyama et al. | 257/347 |
| 6,316,793 | B1 | 11/2001 | Sheppard et al. | 257/103 |
| 6,316,820 | B1 | 11/2001 | Schmitz et al. | 257/649 |
| 6,346,451 | B1 | 2/2002 | Simpson et al. | 438/311 |
| 6,445,038 | B1 | 9/2002 | Tihanyi | 257/347 |
| 6,468,878 | B1 | 10/2002 | Petruzzello et al. | 438/454 |
| 6,483,135 | B1 | 11/2002 | Mizuta et al. | 257/283 |
| 6,559,513 | B1 | 5/2003 | Miller et al. | 257/488 |
| 6,586,781 | B2 | 7/2003 | Wu et al. | 257/194 |
| 2001/0015446 | A1 | 8/2001 | Inoue et al. | |
| 2001/0023964 | A1 | 9/2001 | Wu et al. | |
| 2002/0005528 | A1 | 1/2002 | Nagahara | |
| 2002/0017648 | A1 | 2/2002 | Kasahara et al. | |
| 2002/0137318 | A1 | 9/2002 | Peake et al. | |
| 2002/0155646 | A1 | 10/2002 | Petruzzello et al. | |
| 2003/0006437 | A1 | 1/2003 | Mizuta et al. | |
| 2003/0085409 | A1 | 5/2003 | Shen et al. | |
| 2003/0107081 | A1 | 6/2003 | Lee et al. | |
| 2003/0183844 | A1 | 10/2003 | Yokoyama et al. | |
| 2003/0222327 | A1 | 12/2003 | Yamaguchi et al. | |
| 2004/0207313 | A1 | 10/2004 | Omoto et al. | |
| 2005/0051796 | A1 | 3/2005 | Parikh et al. | |
| 2005/0062069 | A1 | 3/2005 | Saito et al. | |
| 2005/0173728 | A1 | 8/2005 | Saxler | |
| 2006/0019435 | A1* | 1/2006 | Sheppard et al. | 438/167 |
| 2006/0202272 | A1* | 9/2006 | Wu et al. | 257/355 |
| 2007/0090383 | A1 | 4/2007 | Ota et al. | |
| 2008/0036364 | A1 | 2/2008 | Li et al. | |

FOREIGN PATENT DOCUMENTS

| | | |
|---|---|---|
| EP | 0792028 | 8/1997 |
| EP | 0936682 A | 8/1999 |
| EP | 1336989 | 8/2003 |
| EP | 1577951 A2 | 3/2005 |
| JP | 05021793 A | 1/2003 |
| WO | WO 9856043 | 12/1998 |
| WO | WO 03038905 A2 | 5/2003 |
| WO | WO 2004068590 A1 | 8/2004 |
| WO | WO 2005114743 A2 | 12/2005 |

OTHER PUBLICATIONS

Saito et al., Solid-State Electronics, "Theoretical Limit Estimation of Lateral Wide Bandgap Semiconductor Power-Switching Device", Apr. 1, 2003, pp. 1555-1562.

W. Saito et al., "600V AlGaN/GaN Power-HEMT; Design, Fabrication and Demonstration on High Voltage DC-DC Converter", IEEE IEDM vol. 23, No. 7, 2003, pp. 587-590.

Wu et al., "High-Gain Microwave GaN HEMTS With Source-Terminated Field-Plates", CREE Santa Barbara Technology Center.

Ping et al., "DC and Microwave Performance of High Current AlGaN Heterostructure Field Effect Transistors Grown on P-Type SiC Substrates", IEEE Electron Device Letters, vol. 19, No. 2, Feb. 1998, p. 54.

L. Eastman et al., "GaN Materials for High Power Microwave Amplifiers", Materials Research Society vol. 512 WOCSEMMAD, Monterey, CA Feb. 1998, pp. 3-7.

G. Sullivan et al., "High Power 10-GHz Operation of AlGaN HFET's in Insulating SiC", IEEE Electron Device Letters, vol. 19, No. 6, Jun. 1998, p. 198.

Y.F. Wu et al. "Very-High Power Density AlGaN/GaN HEMTS", IEEE Transactions on Electronic Devices, vol. 48, Issue 3, Mar. 2001, p. 586.

Asano K et al, "Novel High Power AlGaAs/GaAs HFET With a Field-Modulating Plate Operated at 35 V Drain Voltage", Electron Devices Meeting 1998, IEDM 98 Technical Digest, International San Francisco, CA USA Dec. 6-9, 1998, Piscataway, NJ USA IEEE US Dec. 6, 1998, pp. 59-62 XP010321500.

Wakejima A et al. "High Power Density and Low Distortion INGAP Channel FETS With Field-Modulating Plate", IEICE Transactions on Electronics, Institute of Electronics Information and Comm. Eng. Tokyo, Japan, vol. E85-C, No. 12, Dec. 2002, pp. 2041-2045 XP001161324.

Mok P. et al, "A Novel High-Voltage High-Speed MESFET Using a Standard GAAS Digital IC Process", IEEE Transactions on Electron Devices, IEEE Inc. New York, US. vol. 41, No. 2, Feb. 1, 1994, pp. 246-250 XP00478051.

Karmalkar S. et al. "Very High Voltage AlGaN/GaN High Electron Mobility Transistors Using a Field Plate Deposited on a Stepped Insulator", Solid State Electronics, Elsevier Science Publishers, Barking. GB, vol. 45, No. 9, Sep. 2001, pp. 1645-1652, XP004317729.

Li, et al. "High Breakdown Voltage GaN HFET With Field Plate", Electronics Letters, IEE Stevenage GB vol. 37, No. 3, Feb. 1, 2001, pp. 196-197, XP006016221.

CRC Press, The Electrical Engineering Handbook, Second Edition, DORF, pp. 994, 1997 "Three-terminal Active Microwave Devices".

B. Gelmont, et al. "Monte Carlo Simulation of Electron Transport in Gallium Nitride", J. Appl. Phys. 74, 1993, pp. 1818-1821.

R. Gaska et al., "Electron Transport in AlGaN-GaN Heterostructures Grown on 6H-SiC Substrates", Appl. Phys. Lett. 72, No. 6, Feb. 1998, pp. 707-709.

Wu et al., "GaN-Based FETS for Microwave Power Amplification", IEICE Trans. Electron. vol. E82-C, No. 11, Nov. 1999, pp. 1895-1905.

Wu et al., "30-W/mm GaN HEMTS by Field Plate Optimization", IEEE Electron Device Letters, vol. 25, No. 3, Mar. 2004, pp. 117-119.

M. Micovic et al., "AlGaN/GaN Heterojunction Field Effect Transistors Grown by Nitrogen Plasma Assisted Molecular Beam Epitaxy", IEEE Trans. Electron Devices, vol. 48, No. 3, Mar. 2001, pp. 591-596.

Gaska, et al., "High-Temperature Performance of AlGaN/GaN HFETS on SiC Substrates", IEEE Electron Device Letters, vol. 18, No. 10, Oct. 1997, pp. 492-494.

Wu et al., "High Al-Content AlGaN/GaN HEMTS on SiC Substrates With Very-High Power Performance", IEDM-1999 Digest, pp. 925-927, Washington D.C., Dec. 1999.

Lu et al., "AlGaN/GaN HEMTS on SiC With Over 100 GHz ft and Low Microwave Noise", IEEE Transactions on Electron Devices, vol. 48, No. 3, Mar. 2001, pp. 581-585.

Wu et al., Bias-Dependent Performance of High-Power AlGaN/GaN HEMTS, IEDM-2001, Washington D.C., Dec. 2-6, 2001, pp. 378-380.

Wu et al., "High Al-Content AlGaN/GaN MODFETS for Ultrahigh Performance", IEEE Electron Device Letters vol. 19, No. 2, Feb. 1998, pp. 50-53.

Zhang et al., "High Breakdown GaN HEMT With Overlapping Gate Structure", IEEE Electron Device Letters, vol. 21, No. 9, Sep. 2000, pp. 421-423.

Karmalkar et al., "Enhancement of Breakdown Voltage in AlGaN/GaN High Electron Mobility Transistors Using a Field Plate", IEEE Trans. Electron Devices, vol. 48, No. 8, Aug. 2001, pp. 1515-1521.

Ando et al., "10-W/mm AlGaN-GaN HFET With a Field Modulating Plate", IEEE Electron Device Letters, vol. 24, No. 5, May 2003, pp. 289-291.

Chini et al., Power and Linearity Characteristics of Field-Plated Recessed-Gate AlGaN-GaN HEMTS, IEEE Electron Device Letters, vol. 25, No. 5, May 2004, pp. 229-231.

Examination Report re European Application No. 02 792 174.1-1235, Dated Oct. 7, 2008.

Related Extended European Search Report re European Application No. 08250197.4-1235/1973163, Dated: 11-06-0.

Xing, "High Breakdown Voltage AlGaN-GaN HEMTS Achieved by Multiple Field Plates", IEEE Electron Device Letters, vol. 25, No. 4, Apr. 2004, pp. 161-163.

Notice Requesting Submission of Opinion re related Korean Application No. 10-2004-7001033, dated: Mar. 9, 2009.

Sakai et al., "Experimental Investigation of Dependence of Electrical Characteristics on Device Parameters in Trench MOS Barrier Shottky Diodes", Proceedings of 1998 International Symposium on Power Semiconductor Devices & ICs, Kyoto, pp. 293-296, Jun. 1998.

Zhang AP et al, "Comparison of GaN P-I-N. and Schottky Rectifier Performance" IEEE Transactions on Electron Devices, IEEE Inc. New York, US, vol. 48, No. 3, pp. 407-411, Mar. 2001.

European Search Report, Feb. 24, 2009, re related European Application No. EP 08253301.

Examination Report from related European Patent Application No. 02769655.8-1235, Dated: Nov. 3, 2008.

Second Office Action from related China Application No. 02818502. 1., Dated: Feb. 19, 2009.

Examination Report from related European Patent Application No. 06851411.6-2203, dated: Jan. 26, 2009.

"Enhancement of Base Conductivity Via the Piezoelectric Effect in AlGaN/GaN HBTs", Asbeck et al., Aug. 18, 1999, Solid State Electronics 44 (2000) 211 219, pp. 211-219.

"New UV Light Emitter based on AlGaN Heterostructures with Graded Electron and Hole Injectors", Johnson et al., XP-002505432, Mat. Res. Soc. Symp. Proc. vol. 743, 2003, Materials Research Society, pp. 1.2.4.1-1.7.4.6.

"Polarization-Induced 3-Dimensional Electron Slabs in Graded AlGaN Layers", Simon et al., XP-002505433, Mater. Res. Soc. Symp. Proc. vol. 892, 2006 Materials Research Society, pp. 1-6.

Examiner's Report from related Canada Patent Application No. 2,399,547, Dated: Mar. 4, 2009.

Result of Examination for related Korean Application No. 10-2004-7001027, Dec. 15, 2009.

IEEE Electron Device Letters, vol. 21, No. 2, Feb. 2000, pp. 63-65, "AlGaN/GaN Metal Oxide Semiconductor Heterostructure Field Effect Transistor,", M. Asif Khan et al.

Japanese Publication No. Hei 11-224881, Aug. 17, 1999, Compound Semiconductor Apparatus.

IEEE Electron Device Letters, vol. 21, No. 9, Sep. 2000, pp. 421-423, "High Breakdown GaN HEMT with Overlapping Gate Structure," N.-Q. Zhang et al.

Related European Examination Report for European Patent Application No. 02769655.8, dated: Dec. 8, 2008.

Related Office Action from Japanese Patent Office re Japanese Patent Application No. 2002-590421, dated: Oct. 21, 2008.

Japanese Patent Application Public Disclosure 2000-68498, Date: Mar. 3, 2000.

Japanese Patent Application Public Disclosure 2001-77353, dated Mar. 23, 2001.

Extended European Search Report, for related European Application No. 07253716.0, Dated: Jun. 25, 2009.

Examination Report re related European Application No. 01 905 364.4, dated: Jun. 24, 2009.

Official Rejection of Japanese Patent Application No. 2003-535260, dated: Jun. 19, 2009.

Patent Abstracts of Japan, Pub. 10-223901, Pub. Date: Aug. 21, 1998.

Khan et al., "AlGaN/GaN Metal-Oxide-Semiconductor Heterostructure Field-Effect Transistors on SiC Substrates", Applied Physics Letters vo. 77, No. 9, Aug. 2000. pp. 1339-1341.

First Examination Report from related European Patent Application No. 08250197.4, dated: Jul. 28, 2009.

Office Action for family related U.S. Appl. No. 11/799,786, dated Sep. 8, 2008.

Office Action for family related U.S. Appl. No. 11/356,791, dated: Sep. 2, 2008.

* cited by examiner

HIGH VOLTAGE GAN TRANSISTORS

GOVERNMENT RIGHTS

The United States Government has rights in this invention pursuant to contract No. N00014-05-C-0226, awarded by the Office of Naval Research.

BACKGROUND OF THE INVENTION

This invention relates to semiconductors, and particularly to transistors for power switching that utilize field plates.

Power semiconductor devices are used as switches or rectifiers in power electronic circuits, such as switch mode power supplies. Common power devices include the power diode, thyristor, power MOSFET and IGBT (insulated gate bipolar transistor). A power diode or MOSFET, for example, operates on principles similar to those of its low power counterparts, but is able to carry a larger amount of current and typically can support a larger reverse-bias voltage in the off state.

Structural changes are often made in power devices to accommodate the higher current density, higher power dissipation and/or higher reverse breakdown voltage required. The vast majority of discrete (i.e., non integrated) power devices are built using a vertical structure, whereas small-signal devices employ a lateral structure. With the vertical structure, the current rating of the device is proportional to its area, and the voltage blocking capability is achieved with the height of the die. In the vertical structure, one of the connections of the device is located on the bottom of the semiconductor.

High electron mobility transistors (HEMTS) are a common type of solid state transistor that is regularly fabricated from semiconductor materials such as Silicon (Si) or Gallium Arsenide (GaAs). One disadvantage of Si is that it has low electron mobility (600-1450 $cm^2$/V-s), which produces a high source resistance that can degrade high performance gain [CRC Press, The Electrical Engineering Handbook, Second Edition, Dorf, p. 994, (1997)].

GaAs based HEMTs have become the standard for signal amplification in civil and military radar, handset cellular, and satellite communications. GaAs has a higher electron mobility (approximately 6000 $cm^2$/V-s) and a lower source resistance than Si, which allows GaAs based devices to function at higher frequencies. However, GaAs, like silicon, has a relatively small bandgap (1.12 eV for silicon and 1.42 eV for GaAs at room temperature) and relatively small breakdown voltage, which prevents GaAs and silicon based HEMTs from providing high power at high frequencies.

In response to these disadvantages with the Si and GaAs materials systems for high power applications, a major breakthrough in power semiconductor devices was achieved with the replacement of silicon by wide bandgap semiconductor, such as silicon carbide (SiC) and the Group III nitrides, e.g., gallium nitride (GaN). These materials typically exhibit higher electric field breakdown strength and higher electron saturation velocity as compared to GaAs and Si. Silicon carbide MOSFETS, for example, deliver 10 to 100 times better performance (or smaller size) than equivalent silicon based devices. SiC Schottky diodes with a breakdown voltage of 1200V are commercially available. As both are majority carrier devices, they can operate at high speed. Bipolar devices are being developed for higher voltages, up to 20 kV. Among its advantages, silicon carbide can operate at higher temperature (up to 400° C.) and has a lower thermal resistance than silicon, allowing better cooling.

In particular, GaN power HEMTs not only exhibit higher efficiency than both SiC and Si MOSFETs, but also perform well at higher frequencies, where Si simply does not function. GaN has the highest figure of merit of any semiconductor device for power switching. GaN HEMTs, owing to their high electron mobility and high breakdown field, exhibit a Baliga DC figure of merit for high voltage power devices which is superior to all other available semiconductors, resulting in ultra-low on resistance and a compact die size.

HEMTs can offer operational advantages in many circumstances because a two dimensional electron gas (2DEG) is formed in the HEMT structure at the heterojunction of two semiconductor materials with different bandgap energies, where the smaller bandgap material has a higher electron affinity. The 2DEG is an accumulation layer in the undoped, smaller bandgap material, and can contain a very high sheet electron concentration, in excess of, for example, $1 \times 10^{13}$ carriers/$cm^2$. In addition, electrons originating in the wider bandgap semiconductor transfer to the 2DEG, allowing a high electron mobility due to reduced ionized impurity scattering. The combination of high carrier concentration and high carrier mobility can give the HEMT a very large transconductance and may provide a strong performance advantage over metal-semiconductor field effect transistors (MESFETs) for high frequency applications.

Innovations in GaN HEMT device technology have increased the breakdown voltage as well as the power performance for devices operable at RF and microwave frequencies greater than 0.5 GHz. High electron mobility transistors fabricated in the gallium nitride/aluminum gallium nitride (GaN/AlGaN) material system have the potential to generate large amounts of RF power because of the combination of material characteristics that includes the aforementioned high breakdown fields, wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

Improvements in the manufacture of wide bandgap semiconductor materials, such as AlGaN/GaN, have helped advance the development of AlGaN/GaN transistors, such as high electron mobility transistors (HEMTs), for high frequency, high temperature and high power applications. AlGaN/GaN has large bandgaps, as well as high peak and saturation electron velocity values [B. Gelmont, K. Kim and M. Shur, Monte Carlo Simulation of Electron Transport in Gallium Nitride, J. Appl. Phys. 74, (1993), pp. 1818-1821]. AlGaN/GaN HEMTs can also exhibit two dimensional electron gas (2DEG) layer sheet densities in excess of $10^{13}$/$cm^2$ and relatively high electron mobility (up to 2019 $cm^2$/Vs) [R. Gaska, et al., Electron Transport in AlGaN—GaN Heterostructures Grown on 6H—SiC Substrates, Appl. Phys. Lett. 72, (1998), pp. 707-709]. These characteristics allow AlGaN/GaN HEMTs to provide very high voltage and high power operation at RF, microwave and millimeter wave frequencies.

AlGaN/GaN HEMTs have been grown on sapphire substrates and have shown a power density of 4.6 W/mm and a total power of 7.6 W [Y. F. Wu et al., GaN-Based FETs for Microwave Power Amplification, IEICE Trans. Electron. E-82-C, (1999). pp. 1895-1905]. More recently, AlGaN/GaN HEMTs grown on SiC have shown a power density of 30 W/mm at 8 GHz [Y.-F. Wu, A. Saxler, M. Moore, R. P. Smith, S. Sheppard, P. M. Chavarkar, T. Wisleder, U. K. Mishra, and P. Parikh, "30-W/mm GaN HEMTs by Field Plate Optimization", *IEEE Electron Device Letters*, Vol. 25, No. 3, pp. 117-119, March 2004.] and a total output power of 22.9 W at 9 GHz [M. Micovic, et al., AlGaN/GaN Heterojunction Field Effect Transistors Grown by Nitrogen Plasma Assisted Molecular Beam Epitaxy, IEEE Trans. Electron. Dev. 48, (2001), pp. 591-596].

U.S. Pat. No. 5,192,987 discloses GaN/AlGaN based HEMTs grown on a buffer and a substrate. Other AlGaN/GaN HEMTs and field effect transistors (FETs) have been described by Gaska, et al., High-Temperature Performance of AlGaN/GaN HFETs on SiC Substrates, IEEE Electron Device Letters, 18, (1997), pp. 492-494; and Wu, et al. "High Al-content AlGaN/GaN HEMTs With Very High Performance", IEDM-1999 Digest, pp. 925-927, Washington D.C., December 1999. Some of these devices have shown a gain-bandwidth product ($f_T$) as high as 100 gigahertz (Lu, et al. "AlGaN/GaN HEMTs on SiC With Over 100 GHz ft and Low Microwave Noise", IEEE Transactions on Electron Devices, Vol. 48, No. 3, March 2001, pp. 581-585) and high power densities up to 10 W/mm at X-band (Wu et al., "Bias-dependent Performance of High-Power AlGaN/GaN HEMTs", IEDM-2001, Washington D.C., Dec. 2-6, 2001) and Wu et al., High Al-Content AlGaN/GaN MOSFETs for Ultrahigh Performance, IEEE Electron Device Letters 19, (1998), pp. 50-53].

Electron trapping and the resulting differences between DC and RF characteristics have been a limiting factor in the performance of these devices. Silicon nitride (SiN) passivation has been successfully employed to alleviate this trapping problem, resulting in high performance devices with power densities over 10 W/mm at 10 Ghz. U.S. Pat. No. 6,586,781, for example, which is incorporated herein by reference in its entirety, discloses methods and structures for reducing the trapping effect in GaN-based transistors. Due to the high electric fields existing in these structures, however, charge trapping is still an issue.

Overlapping gate structures, or field plates, have been used to modify the electric field and thereby enhance the performance of GaN-based HEMTs at microwave frequencies. See Zhang et al., IEEE Electron Device Letters, Vol. 21, pp. 421-423 (September 2000). Karmalkar et al. performed simulations for the field plate structure, predicting up to five times enhancement in breakdown voltages. Karmalkar et al., IEEE Trans. Electron Devices, Vol. 48, pp. 1515-1521 (August 2001). Ando et al. used a similar structure with smaller gate dimensions and demonstrated performance of 10.3 W output power at 2 GHz using a 1 mm wide device on a SiC substrate. Ando et al., IEEE Electron Device Letters, Vol. 24, pp. 289-291 (May 2003). Chini et al. implemented a new variation of the field plate design with further reduced gate dimensions and obtained 12 W/mm at 4 GHz from a 150 µm-wide device on a sapphire substrate. Chini et al., IEEE Electron Device Letters, Vol. 25, No. 5, pp. 229-231 (May 2004). GaN based HEMTs with field plates have boosted power density to greater than 30 W/mm at frequencies up to 8 GHz. See, e.g., Y-F Wu et al, IEEE Electron Device Letters, Vol. 25, No. 3, pp. 117-119 (March 2004).

The approaches known in the art, however, have limitations for high performance applications in power switching. Consequently, a need has developed in the art for power switching devices which performance well at high frequencies, including higher breakdown voltages and lower on resistances.

BRIEF SUMMARY OF THE INVENTION

This invention provides multiple field plate transistors which can maintain high blocking voltages, of 600 Volts and greater, while simultaneously exhibiting on resistances of 7.0 m$\Omega$-cm$^2$ or lower.

A multiple field plate transistor constructed according to the invention includes an active region, a source electrode in electrical contact with the active region, a drain electrode in electrical contact with the active region, and a gate, in electrical contact with the active region, between the source and the drain.

A first insulating spacer layer is disposed over the active region between the source and the gate, while a second insulating spacer layer is disposed over the active region between the drain and the gate.

A first conducting field plate, disposed on the first spacer layer between the source and the gate, is electrically connected to the gate and extends toward the source. A second conducting field plate, disposed on the second spacer layer between the drain and the gate, is electrically connected to the gate and extends toward the drain.

A third insulating spacer layer is disposed on the first spacer layer, the second spacer layer, the first field plate, the gate, and the second field plate between the source and the drain. A third conducting field plate is disposed on the third spacer layer over the gate, the second field plate, and the second spacer layer, and is electrically connected to the source, extending toward the drain.

The transistor may be variously configured:

to exhibit a blocking voltage of at least 600 Volts while supporting a current of at least 2 Amps with an on resistance of no more than 5.0 m$\Omega$-cm$^2$;

to exhibit a blocking voltage of at least 600 Volts while supporting a current of at least 3 Amps with an on resistance of no more than 5.3 m$\Omega$-cm$^2$;

to exhibit a blocking voltage of at least 900 Volts while supporting a current of at least 2 Amps with an on resistance of no more than 6.6 m$\Omega$-cm$^2$; or to exhibit a blocking voltage of at least 900 Volts while supporting a current of at least 3 Amps with an on resistance of no more than 7.0 m$\Omega$-cm$^2$.

In a more particular embodiment, the transistor is a high electron mobility transistor (HEMT) and includes a substrate, a buffer layer on the substrate, and a barrier layer on the buffer layer, the active region being defined by a two dimensional electron gas induced at the heterointerface between the buffer layer and the barrier layer.

In specific configurations, the HEMT embodiment may include a gate that is partially recessed in the barrier layer, a semi-insulating SiC substrate, a GaN buffer layer, an AlN barrier layer, a barrier layer which includes both an AlN layer and an AlGaN layer, spacer layers of SiN, and/or metal field plates.

The invention also encompasses:

A multiple field plate transistor configured to exhibit a blocking voltage of at least 600 Volts while supporting a current of at least 2 Amps with an on resistance of no more than 5.0 m$\Omega$-cm$^2$;

a multiple field plate transistor configured to exhibit a blocking voltage of at least 600 Volts while supporting a current of at least 3 Amps with an on resistance of no more than 5.3 m$\Omega$-cm$^2$;

a multiple field plate transistor configured to exhibit a blocking voltage of at least 900 Volts while supporting a current of at least 2 Amps with an on resistance of no more than 6.6 mΩ-cm$^2$; and a multiple field plate transistor configured to exhibit a blocking voltage of at least 900 Volts while supporting a current of at least 3 Amps with an on resistance of no more than 7.0 mΩ-cm$^2$.

DETAILED DESCRIPTION OF THE INVENTION

Figure 1:
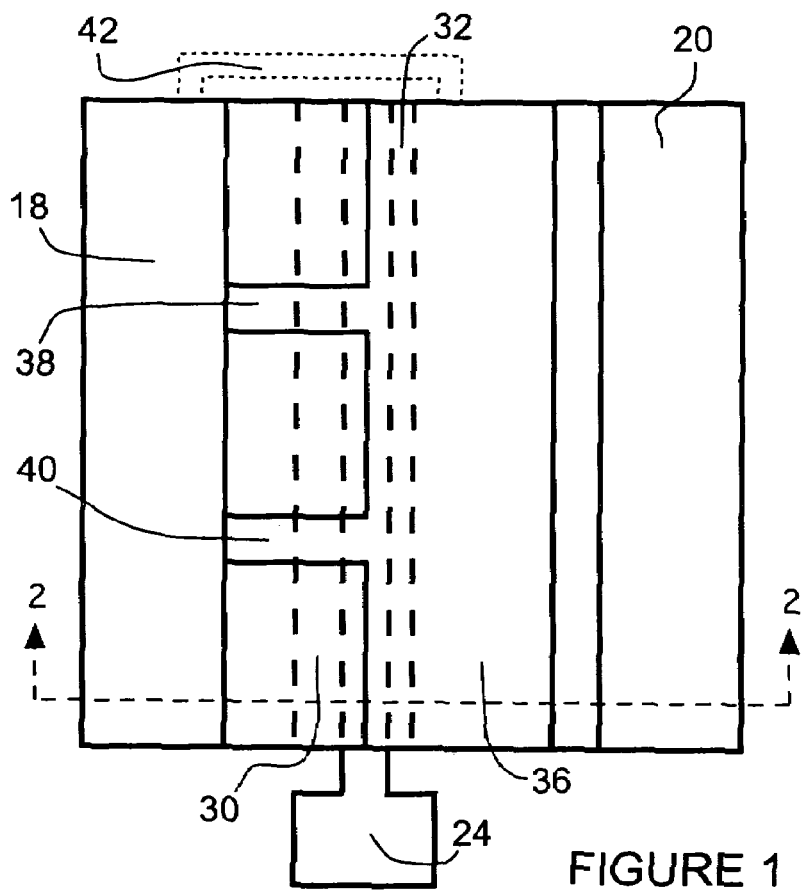
FIG. 1 is a plan view of one embodiment of a high electron mobility transistor (HEMT) constructed according to the present invention.

This invention provides multiple field plate transistors that exhibit increased breakdown voltage and improved power performance, characteristics that are particularly advantageous for power switching applications. In some embodiments, for example, the invention provides transistors with a blocking voltage of at least 600 Volts, while supporting a current of at least 2 Amps with an on resistance of no more than 5.0 mΩ-cm$^2$, and at least 3 Amps, with an on resistance of no more than 5.3 mΩ-cm$^2$; and with a blocking voltage of at least 900 Volts while supporting a current of at least 2 Amps, with an on resistance of no more than 6.6 mΩ-cm$^2$, and at least 3 Amps, with an on resistance of no more than 7.0 mΩ-cm$^2$.

Embodiments of the present invention may be particularly well suited for use in nitride-based devices such as Group III-nitride based HEMTs. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. As well understood by those in this art, the Group III elements can combine with nitrogen to form binary (e.g., GaN), ternary (e.g., AlGaN and AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$, where $0 \leq x \leq 1$, are often used to describe them.

The multiple field plate transistor of the present invention includes an active region, with metal source and drain electrodes in electrical contact with the active region, and a gate between the source and drain electrodes for modulating electric fields within the active region. A first insulating spacer layer is positioned over at least a portion of the active region between the source and the gate. The first spacer layer, which can be formed of a dielectric layer or a combination of multiple dielectric layers, preferably covers the active region between the gate and source electrodes, although it can cover less.

A second insulating spacer layer is positioned over at least a portion of the active region between the drain and the gate. As with the first spacer layer, the second spacer layer can be formed of a dielectric layer or a combination of multiple dielectric layers, and preferably covers the active region between the gate and source electrodes, although it can cover less.

A first conductive field plate is located on the first spacer layer, is electrically connected to the gate, and extends toward the source, with the first spacer layer providing electrical isolation between the first field plate and the active region. A second conductive field plate, also electrically connected to the gate, is located on the second spacer layer and extends toward the drain, the second spacer layer providing electrical isolation between the second field plate and the active region.

A third insulating spacer layer, positioned over the first and second spacer layers, the first and second field plates, and the gate, is located between the source and the drain. A third conductive field plate, located on the third spacer layer, is positioned over the gate, the second field plate and the second spacer, is electrically connected to the source, and extends toward the drain, with the third spacer layer isolating the third field plate.

This field plate arrangement helps to reduce the peak electric field in the transistor, resulting in increased breakdown voltage and reduced trapping. The reduction of the electric field can also yield other benefits, such as reduced leakage currents and enhanced reliability. By having a field plate electrically connected to the source electrode, the reduced gain and instability resulting from gate connected field plates is reduced. When arranged according to the present invention, the shielding effect of a source-connected field plate can reduce capacitance between the gate and the drain ($C_{gd}$), which enhances input-output isolation.

Figure 2:
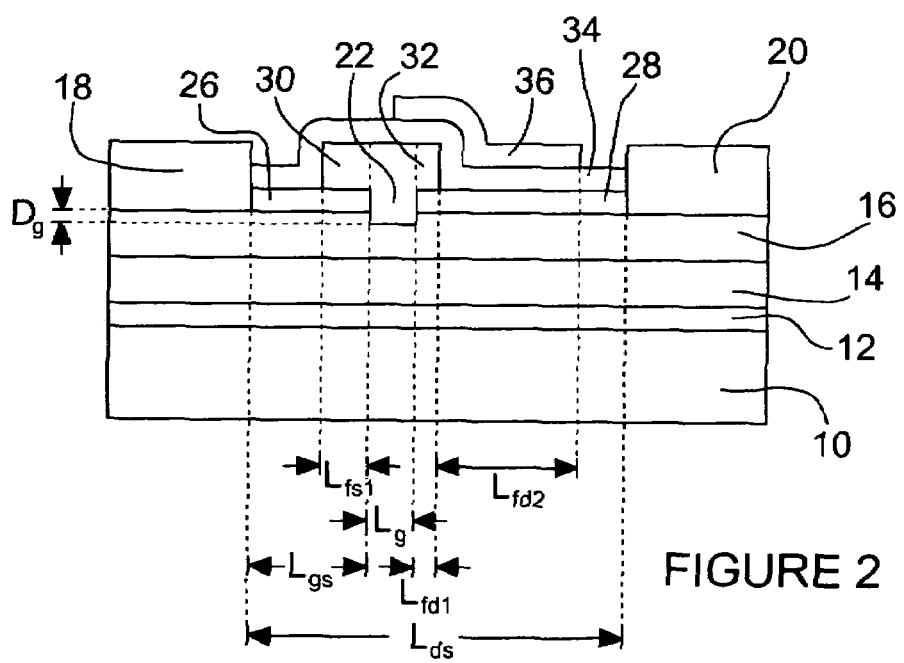
FIG. 2 is a cross sectional view showing the HEMT depicted in FIG. 1.

One type of transistor that can effectively utilize the multiple field plate arrangement of the present invention is a high electron mobility transistor (HEMT). A HEMT constructed according to the present invention is shown in FIGS. 1 and 2, where FIG. 1 is a plan view of the HEMT and FIG. 2 is a cross sectional view. The HEMT includes a substrate 10, which may be a semi-insulating silicon carbide (SiC) substrate such as, for example, a 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

Appropriate SiC substrates are manufactured by, for example, Cree, Inc., of Durham, N.C., the assignee of the present invention, and methods for producing such materials are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like, or any other material or combination of materials capable of supporting growth of a Group III nitride material.

Optional nucleation and/or transition layers may be provided on the substrate 10. A nucleation layer 12, for example, is shown in FIG. 2. Whether a nucleation layer is employed can depend on the material used for the substrate. The nucleation layer provides an appropriate crystal structure transition to reduce the lattice mismatch between the substrate and the next layer in the device. Methods of forming a nucleation layer on various substrates, for example, are taught in U.S. Pat. Nos. 5,290,393 and 5,686,738, each of which are incorporated by reference as if fully set forth herein. Methods of forming nucleation layers on silicon carbide substrates are disclosed in U.S. Pat. Nos. 5,393,993, 5,523,589, and 5,739,554, each of which is incorporated herein by reference as if fully set forth herein. The nucleation layer 12 should be approximately 1000 Å thick, although other thicknesses can be used. The nucleation layer can be deposited on the substrate using many different materials, with a suitable material being $Al_xGa_{1-x}N$ ($0 \leq x \leq 1$), and using known semiconductor growth techniques, such as Metal Oxide Chemical Vapor Deposition (MOCVD), Hydride Vapor Phase Epitaxy (HVPE), or Molecular Beam Epitaxy (MBE).

Additionally, a strain balancing transition layer or layers may also be included as described, for example, in commonly assigned US Patent Application Publication Nos. 20030102482 and 20040012015, the disclosures of which are incorporated herein by reference as if set forth fully herein.

A high resistivity GaN buffer layer 14 is deposited on the substrate 10, using the transitional structure provided by the nucleation layer 12. The buffer layer 14 may be under compressive strain. Furthermore, the buffer layer, as well as the other layers such as the nucleation and transition layers, may be deposited by MOCVD (Metal Organic Chemical Vapor Deposition) or by other semiconductor growth techniques known to those skilled in the art, such as MBE (Molecular Beam Epitaxy) or HVPE (Hydride Vapor Phase Epitaxy).

The buffer layer can be fabricated with doped or undoped layers of Group III nitride materials, with a preferred buffer layer made of a Group III nitride material such as $Al_xGa_yIn_{1-x-y}N$ ($0 \leq x \leq 1$, $0 \leq y \leq 1$, $x+y \leq 1$).

A barrier layer 16 is deposited on the buffer layer 14, the buffer layer having a bandgap that is less than the bandgap of the barrier layer and having a larger electron affinity than the barrier layer. Like the buffer layer 14, the barrier layer 16 can be doped or undoped layers of Group III nitride materials. The barrier layer may be AlN or, in certain embodiments, the barrier layer may include multiple layers, such as an AlN layer and an AlGaN layer. Examples of suitable barrier layer are described in U.S. Pat. Nos. 6,316,793, 6,586,781, and 6,548,333, as well as US Patent Application Publication Nos. 20020167023 and 200300020092, each of which is incorporated by reference as though fully set forth herein. Other nitride based HEMT structures are illustrated in U.S. Pat. Nos. 5,192,987 and 5,296,395, the disclosures of which are incorporated herein by reference as if set forth fully herein.

The barrier layer, for example, may include an AlN layer having a thickness of about 0.8 nm and an AlGaN layer having 24% Al and a thickness of about 250 Å. The barrier layer should be thick enough, and should have a high enough Al composition and doping, to induce a significant carrier concentration at the interface between the buffer layer 14 and the barrier layer 16 through polarization effects. This causes a two dimensional electron gas (2DEG), known as the active region, to be formed at the heterointerface between the buffer layer and the barrier layer.

A source contact 18 and a drain contact 20 are provided as ohmic contacts to the barrier layer 16. Ohmic contacts are processed (e.g., by annealing) to provide low resistivity connections through the barrier layer to the active region. A gate contact 22 on the barrier layer may extend into the barrier layer to a depth $D_g$. As shown in FIG. 1, an external electrical connection 24 may be provided to the gate 22. Electric current can flow between the source and drain electrodes through the 2DEG that is induced at the heterointerface between the buffer layer and the barrier layer when the gate is biased at the appropriate level.

The source and drain electrodes 18 and 20 can be made of a variety of materials including, but not limited to, alloys of titanium, aluminum, gold and nickel. The gate 22 can also be made of different materials including, but not limited to, gold, nickel, platinum, titanium, chromium, alloys of titanium and tungsten, and platinum silicide. The length $L_g$ of the gate 22 can vary, with a suitable length being in the range of 0.1 to 2 µm, although other gate lengths can be used. In one embodiment according to the present invention a preferred gate length $L_g$ is approximately 0.5 µm.

A first insulating spacer layer 26 is deposited on the barrier layer between the source and the gate, while a second insulating spacer layer 28 is deposited on the barrier layer between the drain and the gate. Optionally, the layers 26 and 28 may be initially formed as a single layer, which is subsequently etched through to form the gate 22. The spacer layers 26 and 28 can be dielectric layers or a combination of multiple dielectric layers. Different dielectric materials can be used, such as SiN, $SiO_2$, Si, Ge, $MgO_x$, $MgN_x$, ZnO, $SiN_x$, $SiO_x$, as well as alloys and layer sequences thereof. The spacer layer can be many different thicknesses, with a suitable range of thicknesses being approximately 0.05 to 2 µm.

When the spacer layers are formed before device metallization, the layers can be an epitaxial material, such as a Group III nitride material having different Group III elements, such as alloys of Al, Ga, or In, with a suitable spacer layer material being $Al_xGa_{1-x}N$ ($0.1 \leq x \leq 1$). After epitaxial growth of the barrier layer 16, the spacer layers 26 and 28 can be grown using the same epitaxial growth method.

A first conducting field plate 30 on the spacer layer 26, between the source and the gate, is electrically connected to the gate 22. A second conducting field plate 32 on the spacer layer 28, between the drain and the gate, is also electrically connected to the gate. The field plates 30 and 32 can be formed from many different conductive materials, with a suitable material being a metal deposited using standard metallization techniques. Transistors with field plates and methods of fabricating such transistors are described, for example, in US Patent Application Publication Nos. 20050051796 and 20050051800, and International Application Publication No. WO/2005/024909, the disclosures of which are incorporated herein by reference as if set forth in their entirety.

A third insulating spacer layer 34 is formed over the first and second spacer layers 26 and 28, the first and second field plates 30 and 32, and the gate 22, between the source and the drain. This spacer layer can be formed of materials and by processes similar to those discussed above with respect to the first and second spacer layers.

A third conducting field plate 36 is deposited on the third spacer layer over the gate, the second field plate, and the second spacer layer, extend toward the drain and electrically connected to the source. The third field plate may be electrically connected to the source in a variety of ways. FIG. 1 shows, for example, a connection via the conductive buses 38 and 40. Alternatively, an external bus 42 can make the connection. Other connection structures could also be used. Different numbers of buses can be used although the more buses employed, the greater the unwanted capacitance that may be introduced. There should be a sufficient number of buses so that current can effectively spread from the source into the field plate, while covering as little of the HEMT's active region as possible, in order to minimize the amount of undesirable capacitance that is introduced.

After deposition of the third field plate and its connection to the source electrode, the active structure can be covered by a dielectric passivation layer (not shown), such as silicon nitride. Methods of forming the dielectric passivation layer are described in detail in the patents and publications referenced above.

Figure 3:
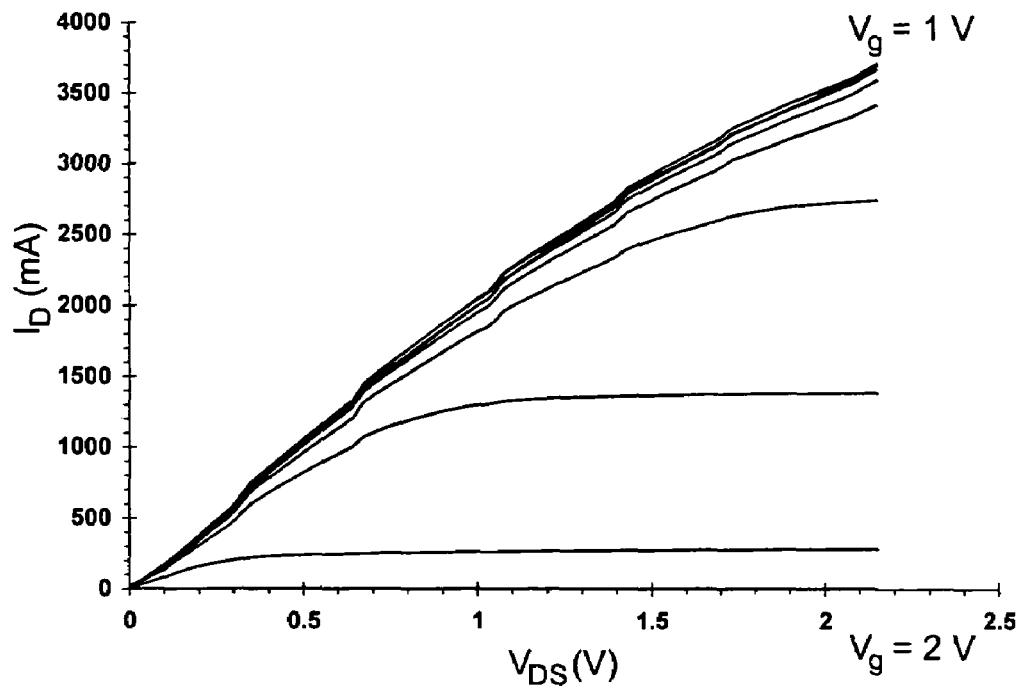
FIG. 3 is a plot of drain current $I_D$ versus drain-to-source voltage $V_{DS}$, showing the performance of a 600 V HEMT constructed according to the present invention at various gate voltages between 1 V and −2V.
Figure 4:
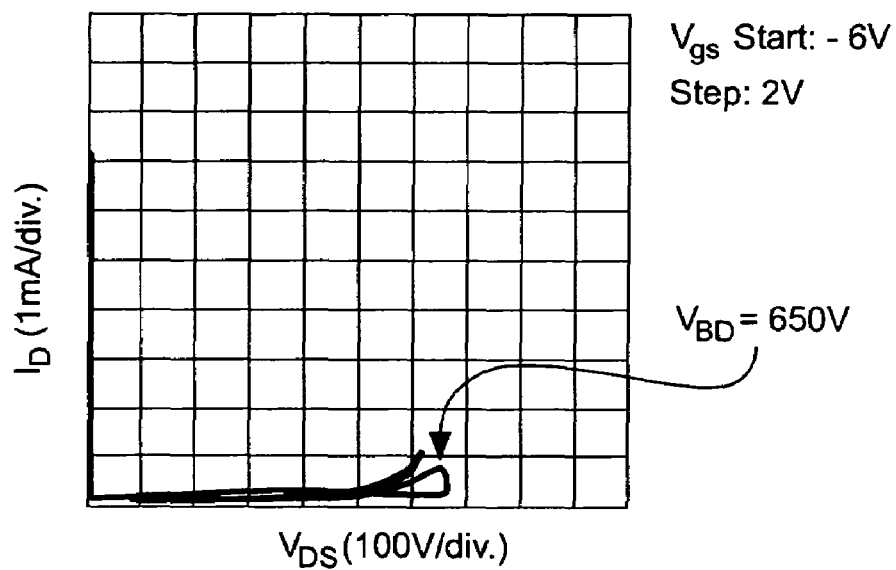
FIG. 4 is a plot of drain current $I_D$ versus drain-to-source voltage $V_{DS}$, showing that the HEMT represented in FIG. 3 achieved a blocking voltage of 600 V.

Performance results were obtained for devices fabricated similar to the HEMT illustrated in FIGS. 1 and 2. As shown in FIGS. 3 and 4, a blocking voltage of greater than 600 V was achieved with an on resistance of less than 5.0 mΩ-cm$^2$, in a device capable of carrying a 2 A current. This device also exhibited an on resistance of less than 5.3 mΩ-cm$^2$ while carrying 3 A of current. The device was a GaN HEMT on a SiC substrate, with a device area of 0.01 cm$^2$ (1×1 mm$^2$) and a barrier layer that included an AlN layer with a thickness of 4 Å and an AlGaN layer with a thickness of 250 Å. The thickness of the first spacer layer was 0, the second spacer layer approximately 1200 Å, and the third spacer layer approximately 1500 Å. Design dimensions included (referring to FIG. 2) a gate contact length $L_g$ of 1.2 μm, distance from gate to drain $L_{gd}$ of 13.3 μm, distance from drain to source $L_{ds}$ of 16 μm, second field plate width $L_{fd1}$ of 1.8 μm, and third field plate width $L_{fd2}$ of 4.5 μm.

FIG. 3 is a plot of drain current $I_D$ versus drain-to-source voltage $V_{DS}$ for this device, for gate voltages $V_g$ varying from 1 V to 2 V. FIG. 4 shows that the device achieved a blocking voltage $V_{BD}$ of 600 V.

Figure 5:
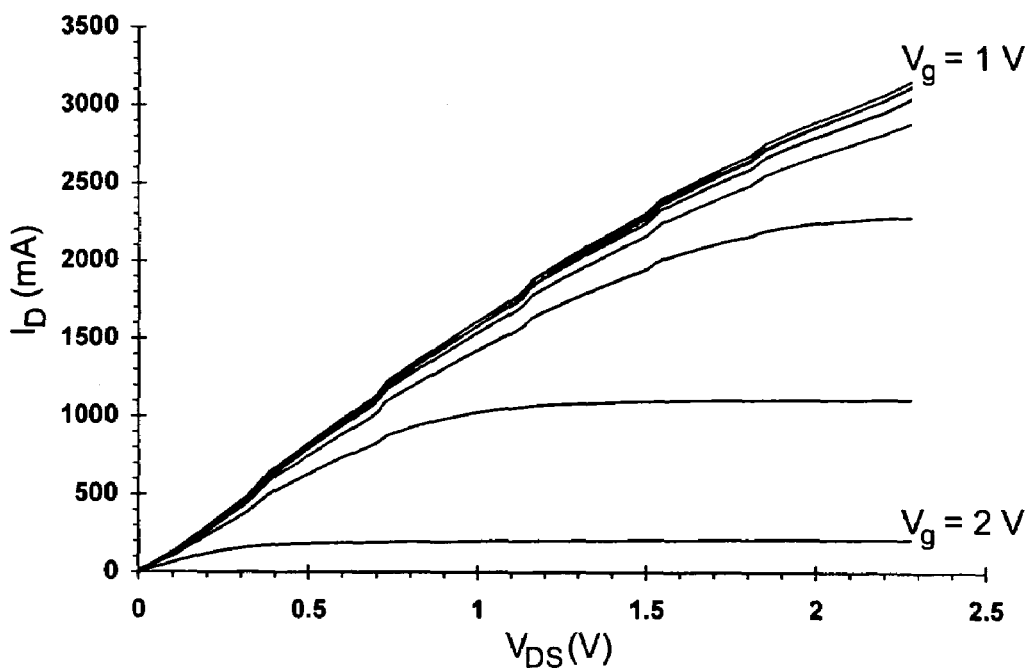
FIG. 5 is a plot of drain current $I_D$ versus drain-to-source voltage $V_{DS}$, showing the performance of a 900 V HEMT constructed according to the present invention at various gate voltages between 1 V and −2V.
Figure 6:
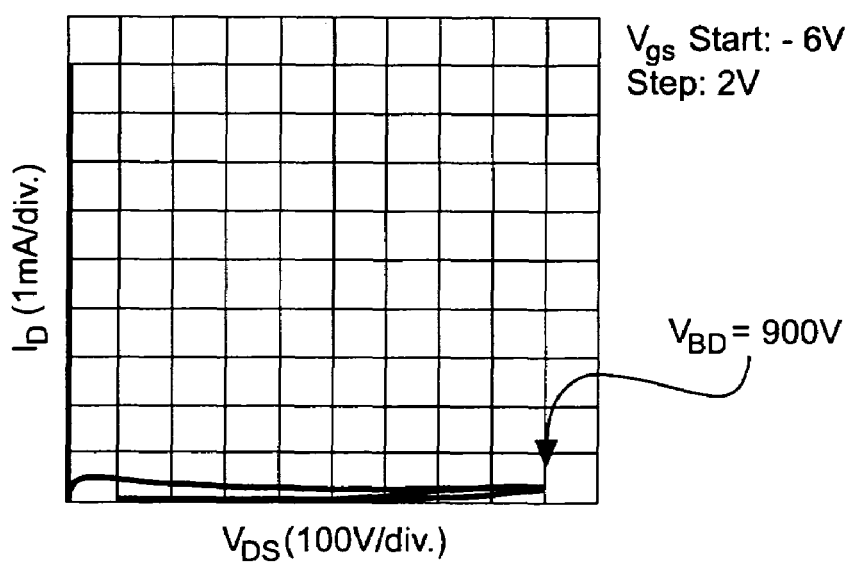
FIG. 6 is a plot of drain current $I_D$ versus drain-to-source voltage $V_{DS}$, showing that the HEMT represented in FIG. 5 achieved a blocking voltage of over 900 V.

As shown in FIGS. 5 and 6, a blocking voltage of greater than 900 V was achieved with an on resistance of less than 6.6 mΩ-cm$^2$, in a device capable of carrying a 2 A current. This device also exhibited an on resistance of less than 7.0 mΩ-cm$^2$ while carrying 3 A of current. The device was a GaN HEMT on a SiC substrate, with a device area of 0.01 cm$^2$ (1×1 mm$^2$) and a barrier layer that included an AlN layer with a thickness of 4 Å and an AlGaN layer with a thickness of 250 Å. The thickness of the first spacer layer was 0, the second spacer layer approximately 1200 Å, and the third spacer layer approximately 1500 Å. Design dimensions included (referring to FIG. 2) a gate contact length $L_g$ of 1.5 μm, distance from gate to drain $L_{gd}$ of 18.0 μm, distance from drain to source $L_{ds}$ of 21.5 μm, second field plate width $L_{fd1}$ of 1.5 μm, and third field plate width $L_{fd2}$ of 4.5 μm.

FIG. 5 is a plot of drain current $I_D$ versus drain-to-source voltage $V_{DS}$ for this device, for gate voltages $V_g$ varying from 1 V to -2 V. FIG. 6 shows that the device achieved a blocking voltage $V_{BD}$ of 900 V.

While embodiments of the present invention are described with reference to particular structures, other structures and/or techniques for fabricating the inventive devices could also be utilized in some embodiments of the invention. Such structures and/or techniques may include those described, for example, in US commonly assigned U.S. Pat. No. 6,316,793 "Nitride Based Transistors on Semi-Insulating Silicon Carbide Substrates", US Patent Application Publication No. 2002/0066908 "Aluminum Gallium Nitride/Gallium Nitride High Electron Mobility Transistors having a Gate Contact on a Gallium Nitride Based Cap Segment and Methods of Fabricating Same", US Patent Application Publication No. 2002/0167023 "Group III Nitride Based High Electron Mobility Transistor (HEMT) with Barrier/Spacer Layer", US Patent Application Publication No. 20040061129 "Nitride-based Transistors and Methods of Fabrication Thereof Using Non-Etched Contact Recesses", US Patent Application Publication No. 20050173728 "Nitride Heterojunction Transistors Having Charge-Transfer Induced Energy Barriers and Methods of Fabricating the Same", US Patent Application Publication No. 20060019435 "Methods of Fabricating Nitride-Based Transistors with a Cap Layer and a Recessed Gate", US Patent Application Publication No. 20050258451 "Methods of Fabricating Nitride-Based Transistors having Regrown Ohmic Contact Regions and Nitride-Based Transistors having Regrown Ohmic Contact Regions", US Patent Application Publication No. 20050258450 "Semiconductor Devices having a Hybrid Channel Layer, Current Aperture Transistors and Methods of Fabricating Same", US Patent Application Publication No. 20030020092 "Insulating Gate AlGaN/GaN HEMT", and US Patent Application Publication No. 20060108606 "Cap Layers and/or Passivation Layers for Nitride-Based Transistors, Transistor Structures and Methods of Fabricating Same," the disclosures of which are incorporated herein as if described in their entirety.

Note that the terminology used in this specification describes particular embodiments only and is not intended to be limiting of the invention. In the drawings, the thicknesses of such components as layers and regions may be exaggerated for clarity. Like numbers refer to like elements throughout the specification. The term "and/or" includes any and all combinations of one or more of the associated listed items.

The singular forms "a", "an" and "the" are intended to include the plural forms as well, unless the context clearly indicates otherwise. The terms "comprises" and/or "comprising," when used in this specification, identify the presence of stated features, integers, steps, operations, elements, and/or components, but do not preclude the presence or addition of one or more other features, integers, steps, operations, elements, components, and/or groups thereof. The term "approximately" used to describe measurements of length in this disclosure refers to dimensions falling within plus or minus 0.2 microns of the length specified.

When an element, such as a layer, region or substrate, is referred to as being "on" or extending "onto" another element, it can be directly on or extend directly onto the other element or intervening elements may also be present. In contrast, when an element is referred to as being "directly on" or extending "directly onto" another element, there are no intervening elements present. In addition, when an element is referred to as being "connected" or "coupled" to another element, it can be directly connected or coupled to the other element or intervening elements may be present. In contrast, when an element is referred to as being "directly connected" or "directly coupled" to another element, no intervening elements are present.

Although the terms first, second, etc. may be used to describe various elements, such as components, regions, layers and/or sections, these elements are not limited by these terms. Rather, the terms are used to distinguish one element, component, region, layer or section from another. Thus, for example, a first element, component, region, layer or section could be termed a second element, component, region, layer or section without departing from the teachings of the present invention.

Relative terms, such as "lower" or "bottom" and "upper" or "top," may be used to describe one element's relationship to another element as illustrated in the drawings. Such relative terms are intended to encompass different orientations of the device in addition to the orientation depicted in the drawings. If a device in a drawing is turned over, for example, elements described as being on the "lower" sides of other elements would then be oriented on the "upper" sides of the other elements. The exemplary term "lower" can therefore encompass both "lower" and "upper," depending on the particular orientation of the drawing figure. Similarly, the exemplary terms "below" or "beneath" can encompass both above and below orientations. Furthermore, the term "outer" may be used to refer to a surface and/or layer that is farthest away from a substrate.

Embodiments of the invention are described with reference to plan view, cross sectional, and/or other illustrations that schematically depict idealized embodiments of the present invention. Consequently, variations from the shapes of the illustrations as a result, for example, of manufacturing techniques and/or tolerances, are to be expected. Embodiments of the invention should thus not be construed as limited to the particular shapes illustrated but include deviations that result, for example, from manufacturing. An etched region depicted as a rectangle, for example, will in reality typically have tapered, rounded or curved features. References to a structure or feature that is disposed "adjacent" another feature may have portions that overlap or underlie the adjacent feature.

Unless otherwise defined, all terms used herein, including technical and scientific terms, have the meanings commonly understood by one of ordinary skill in the art to which this invention pertains. Furthermore, terms such as those defined in commonly used dictionaries should be interpreted as having a meaning that is consistent with their meaning in the context of the relevant art; such terms should not be interpreted in an idealized or overly formal sense unless expressly so defined herein.

Although the invention has been described and illustrated in detail by referring to certain preferred configurations, other versions, including modifications and additional embodiments, will undoubtedly be apparent to those skilled in the art. The field plate arrangement, for example, can be used in many different devices. The field plates can also have many different shapes and can be connected to the source contact in many different ways. In addition, although the invention is particularly useful for power switching applications, it can be used as well for other applications, such as, for example, DC-DC converters for switched mode power supplies and high voltage motor drives to help increase efficiency and reduce size in such systems. Accordingly, the spirit and scope of the invention should not be limited to the embodiments of the invention as described in this specification. Rather, these embodiments are provided to make this disclosure thorough and complete, and to fully convey the scope of the invention to those skilled in the art.

Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are intended to define the full scope of the invention.

The invention claimed is:

1. A multiple field plate transistor, comprising:
   an active region;
   a source electrode in electrical contact with said active region;
   a drain electrode in electrical contact with said active region;
   a gate, in electrical contact with said active region, between said source and said drain;
   a first insulating spacer layer disposed over said active region between said source and said gate;
   a second insulating spacer layer disposed over said active region between said drain and said gate;
   a first conducting field plate, disposed on said first spacer layer between said source and said gate, electrically connected to said gate and extending toward said source;
   a second conducting field plate, disposed on said second spacer layer between said drain and said gate, electrically connected to said gate and extending toward said drain;
   a third insulating spacer layer, disposed on said first spacer layer, said second spacer layer, said first field plate, said gate, and said second field plate, between said source and said drain; and
   a third conducting field plate, disposed on said third spacer layer over said gate, said second field plate, and said second spacer layer, electrically connected to said source and extending toward said drain, wherein said transistor has an $L_g$ length ranging from approximately 1.2 microns to approximately 1.5 microns, an $L_{gd}$ length ranging from approximately 13.3 microns to approximately 18 microns, a $L_{ds}$ length ranging from approximately 16 microns to 21.5 microns, an $L_{fd1}$ length ranging from approximately 1.5 microns to 1.8 microns, and an $L_{fd2}$ length of approximately 4.5 microns.

2. The transistor of claim 1, wherein said transistor has an $L_g$ length of approximately 1.2 microns, an $L_{gd}$ length of approximately 13.3 microns, an $L_{ds}$ length of approximately 16 microns, an $L_{fd1}$ length of approximately 1.8 microns, and an $L_{fd2}$ length of approximately 4.5 microns and the transistor is configured to exhibit a blocking voltage of at least 600 Volts while supporting a current of at least 2 Amps with an on resistance of no more than 5.0 mΩ-cm$^2$.

3. The transistor of claim 1, wherein said transistor has an $L_g$ length of approximately 1.2 microns, an $L_{gd}$ length of approximately 13.3 microns, an $L_{ds}$ length of approximately 16 microns, an $L_{fd1}$ length of approximately 1.8 microns, and an $L_{fd2}$ length of approximately 4.5 microns and the transistor is configured to exhibit a blocking voltage of at least 600 Volts while supporting a current of at least 3 Amps with an on resistance of no more than 5.3 mΩ-cm$^2$.

4. The transistor of claim 1, wherein said transistor has an $L_g$ length of approximately 1.5 microns, an $L_{gd}$ length of approximately 18 microns, an $L_{ds}$ length of approximately 21.5 microns, an $L_{fd1}$ length of approximately 1.5 microns, and an $L_{fd2}$ length of approximately 4.5 microns and the transistor is configured to exhibit a blocking voltage of at least 900 Volts while supporting a current of at least 2 Amps with an on resistance of no more than 6.6 mΩ-cm$^2$.

5. The transistor of claim 1, wherein said transistor has an $L_g$ length of approximately 1.5 microns, an $L_{gd}$ length of approximately 18 microns, an $L_{ds}$ length of approximately 21.5 microns, an $L_{fd1}$ length of approximately 1.5 microns, and an $L_{fd2}$ length of approximately 4.5 microns and the transistor is configured to exhibit a blocking voltage of at least 900 Volts while supporting a current of at least 3 Amps with an on resistance of no more than 7.0 mΩ-cm$^2$.

6. The transistor of claim 1, wherein said first spacer layer and said second spacer layer comprise portions of a single layer disposed on the surface of said active region.

7. The transistor of claim 1, wherein said transistor comprises a high electron mobility transistor.

8. The transistor of claim 7, wherein said transistor further comprises:

a substrate;

a buffer layer disposed on said substrate; and a barrier layer disposed on said buffer layer, the active region being defined by a two dimensional electron gas induced at the heterointerface between the buffer layer and the barrier layer.

9. The transistor of claim 8, wherein said substrate comprises a semi-insulating SiC substrate.

10. The transistor of claim 8, wherein said buffer layer comprises a GaN buffer layer.

11. The transistor of claim 8, wherein said barrier layer comprises an AlGaN barrier layer.

12. The transistor of claim 8, wherein said barrier layer comprises an AlN layer and an AlGaN layer.

13. The transistor of claim 8, wherein said first spacer layer comprises a first SiN spacer layer, said second spacer layer comprises a second SiN spacer layer, and said third spacer layer comprises a third SiN spacer layer.

14. The transistor of claim 8, wherein said first field plate comprises a first metal field plate, said second field plate comprises a second metal field plate, and said third field plate comprises a third metal field plate.

15. A multiple field plate high electron mobility transistor, comprising:

a substrate;

a buffer layer disposed on said substrate;

a barrier layer disposed on said buffer layer;

the heterointerface between the buffer layer and the barrier layer inducing a two dimensional electron gas to define an active region;

a source electrode on said barrier layer and in electrical contact with said active region;

a drain electrode on said barrier layer and in electrical contact with said active region;

a gate, on said barrier layer and in electrical contact with said active region, between said source and said drain;

a first insulating spacer layer disposed on said barrier layer between said source and said gate;

a second insulating spacer layer disposed on said barrier layer between said drain and said gate;

a first conducting field plate, disposed on said first spacer layer between said source and said gate, electrically connected to said gate and extending toward said source;

a second conducting field plate, disposed on said second spacer layer between said drain and said gate, electrically connected to said gate and extending toward said drain;

a third insulating spacer layer, disposed on said first spacer layer, said second spacer layer, said first field plate, said gate, and said second field plate, between said source and said drain; and a third conducting field plate, disposed on said third spacer layer over said gate, said second field plate, and said second spacer layer, electrically connected to said source and extending toward said drain, wherein said transistor has length ranging from approximately 1.2 microns to approximately 1.5 microns, an $L_{gd}$ length ranging from approximately 13.3 microns to approximately 18 microns, an $L_{ds}$ length ranging from approximately 16 microns to 21.5 microns, an $L_{fd1}$ length ranging from approximately 1.5 microns to 1.8 microns, and an $L_{fd2}$ length of approximately 4.5 microns.

16. The transistor of claim 15, wherein said transistor has an $L_g$ length of approximately 1.2 microns, an $L_{gd}$ length of approximately 13.3 microns, an $L_{ds}$ length of approximately 16 microns, an $L_{fd1}$ length of approximately 1.3 microns, and an $L_{fd2}$ length of approximately 4.5 microns and wherein said transistor is configured to exhibit a blocking voltage of at least 600 Volts while supporting a current of at least 2 Amps with an on resistance of no more than 5.0 mΩ-cm$^2$.

17. The transistor of claim 15, wherein said transistor has an $L_g$ length of approximately 1.2 microns, an $L_{gd}$ length of approximately 13.3 microns, an $L_{ds}$ length of approximately 16 microns, an $L_{fd1}$ length of approximately 1.8 microns, and an $L_{fd2}$ length of approximately 4.5 microns and wherein said transistor is configured to exhibit a blocking voltage of at least 600 Volts while supporting a current of at least 3 Amps with an on resistance of no more than 5.3 mΩ-cm$^2$.

18. The transistor of claim 15, wherein said transistor has an $L_g$ length of approximately 1.5 microns, an $L_{gd}$ length of approximately 18 microns, an $L_{ds}$ length of approximately 21.5 microns, an $L_{fd1}$ length of approximately 1.5 microns, and an $L_{fd2}$ length of approximately 4.5 microns and wherein said transistor is configured to exhibit a blocking voltage of at least 900 Volts while supporting a current of at least 2 Amps with an on resistance of no more than 6.6 mΩ-cm$^2$.

19. The transistor of claim 15, wherein said transistor has an $L_g$ length of approximately 1.5 microns, an $L_{gd}$ length of approximately 18 microns, an $L_{ds}$ length of approximately 21.5 microns, an $L_{fd1}$ length of approximately 1.5 microns, and an $L_{fd2}$ length of approximately 4.5 microns and wherein said transistor is configured to exhibit a blocking voltage of at least 900 Volts while supporting a current of at least 3 Amps with an on resistance of no more than 7.0 mΩ-cm$^2$.

* * * * *

UNITED STATES PATENT AND TRADEMARK OFFICE
CERTIFICATE OF CORRECTION

PATENT NO.        : 7,692,263 B2                                              Page 1 of 1
APPLICATION NO.   : 11/603427
DATED             : April 6, 2010
INVENTOR(S)       : Yifeng Wu et al.

It is certified that error appears in the above-identified patent and that said Letters Patent is hereby corrected as shown below:

- Column 14, Line 9, is written as: transistor has length ranging from approximately 1.2

It should read as: transistor has $L_g$ length ranging from approximately 1.2

- Column 14, Line 19, is written as: 16 microns, an $L_{fd1}$ length of approximately 1.3 microns, and It should read as: 16 microns, an $L_{fd1}$ length of approximately 1.8 microns, and Signed and Sealed this Twenty-eighth Day of September, 2010

David J. Kappos
*Director of the United States Patent and Trademark Office*